(12) United States Patent
Kim et al.

(10) Patent No.: US 9,991,371 B2
(45) Date of Patent: Jun. 5, 2018

(54) SEMICONDUCTOR DEVICE INCLUDING TWO-DIMENSIONAL MATERIAL

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Un Jeong Kim, Osan-si (KR); Hyo Chul Kim, Yongin-si (KR); Young Geun Roh, Seoul (KR); Yeon Sang Park, Seoul (KR); Jae Gwan Chung, Seoul (KR); Si Young Lee, Suwon-si (KR); Young Hee Lee, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 10 days.

(21) Appl. No.: 15/291,607

(22) Filed: Oct. 12, 2016

(65) Prior Publication Data
US 2017/0110564 A1   Apr. 20, 2017

(30) Foreign Application Priority Data
Oct. 16, 2015   (KR) .................. 10-2015-0144946

(51) Int. Cl.
*H01L 29/88*   (2006.01)
*H01L 29/73*   (2006.01)
(Continued)

(52) U.S. Cl.
CPC ...... *H01L 29/778* (2013.01); *H01L 29/66037* (2013.01); *H01L 29/66969* (2013.01);
(Continued)

(58) Field of Classification Search
CPC ............ H01L 29/778; H01L 29/66037; H01L 29/66969; H01L 29/7311; H01L 29/7391;
(Continued)

(56) References Cited

U.S. PATENT DOCUMENTS

2011/0229073 A1*  9/2011  Sirringhaus ......... H01L 51/5203
                                                             385/14
2011/0291068 A1*  12/2011 Kobayashi ........ H01L 29/66742
                                                             257/9
(Continued)

FOREIGN PATENT DOCUMENTS

CN   103928340 A   7/2014
JP   2004-319649 A   11/2004
(Continued)

OTHER PUBLICATIONS

Choi, et al., "Lateral MoS$_2$ p-n Junction Formed by Chemical Doping for Use in High-Performance Optoelectronics", American Chemical Society, Aug. 17, 2014, vol. 8, Issue No. 9, pp. 9332-9340, http://pubs.acs.o rg/doi/abs/10.1021/nn503284n.
(Continued)

*Primary Examiner* — Allen Parker
*Assistant Examiner* — Long H Le
(74) *Attorney, Agent, or Firm* — Sughrue Mion, PLLC

(57) ABSTRACT

A semiconductor device includes a substrate, a two-dimensional (2D) material layer formed on the substrate and having a first region and a second region adjacent to the first region, and a source electrode and a drain electrode provided to be respectively in contact with the first region and the second region of the 2D material layer, the second region of the 2D material layer including an oxygen adsorption material layer in which oxygen is adsorbed on a surface of the second region.

17 Claims, 17 Drawing Sheets

(51) Int. Cl.
  *H01L 29/778* (2006.01)
  *H01L 31/119* (2006.01)
  *H01L 29/66* (2006.01)
  *H01L 29/739* (2006.01)
  *H01L 29/885* (2006.01)
  *H01L 31/032* (2006.01)
  *H01L 31/113* (2006.01)
  *H01L 29/16* (2006.01)
  *H01L 29/24* (2006.01)
  *H01L 29/41* (2006.01)

(52) U.S. Cl.
  CPC ...... *H01L 29/7311* (2013.01); *H01L 29/7391* (2013.01); *H01L 29/88* (2013.01); *H01L 29/882* (2013.01); *H01L 29/885* (2013.01); *H01L 31/032* (2013.01); *H01L 31/1136* (2013.01); *H01L 29/1606* (2013.01); *H01L 29/24* (2013.01); *H01L 29/242* (2013.01); *H01L 29/413* (2013.01)

(58) Field of Classification Search
  CPC ..... H01L 29/88; H01L 29/882; H01L 29/885; H01L 29/1606; H01L 29/24; H01L 29/242; H01L 29/413; H01L 31/032; H01L 31/1136
  See application file for complete search history.

(56) References Cited

U.S. PATENT DOCUMENTS

| | | | | |
|---|---|---|---|---|
| 2012/0184065 | A1* | 7/2012 | Gharib | C01B 31/043 438/99 |
| 2014/0197459 | A1* | 7/2014 | Kis | H01L 29/66742 257/194 |
| 2015/0122315 | A1 | 5/2015 | Shin et al. | |
| 2015/0294875 | A1* | 10/2015 | Khondaker | H01L 21/02175 257/411 |
| 2016/0248007 | A1* | 8/2016 | Hersam | H01L 27/2463 |

FOREIGN PATENT DOCUMENTS

KR  10-2015-0051823 A  5/2015
KR  10-2015-0090362 A  8/2015

OTHER PUBLICATIONS

Li, et al., "Carrier Control of MoS$_2$ Nanoflakes by Functional Self-Assembled Monolayers", American Chemical Society, Aug. 16, 2013, vol. 7, Issue No. 9, pp. 7795-7804, http://pubs.acs.org/doi/pdf/10.1021/nn402682j.

* cited by examiner

SEMICONDUCTOR DEVICE INCLUDING TWO-DIMENSIONAL MATERIAL

CROSS-REFERENCE TO RELATED APPLICATION(S)

This application claims priority from Korean Patent Application No. 10-2015-0144946, filed on Oct. 16, 2015, in the Korean Intellectual Property Office, the disclosure of which is incorporated herein by reference in its entirety.

BACKGROUND

1. Field

The exemplary embodiments disclosed herein relate to a semiconductor device, and more particularly, to a semiconductor device including a two-dimensional (2D) material.

2. Description of Related Art

A two-dimensional (2D) material is a single-layered solid of atoms having a predetermined crystal structure, and graphene is a representative 2D material. Graphene has a monoatomic layer structure in which carbon atoms form a hexagonal structure. Graphene may have a symmetrical band structure on the basis of a Dirac point, and since an effective mass of electric charges at the Dirac point is very small, the graphene may have a charge mobility at least ten times (significantly thousands times or more) greater than that of silicon (Si). Further, graphene may have a very large Fermi velocity. Such graphene has entered the spotlight as a next-generation material that can overcome limitations of existing devices, and by starting research on such graphene, research and development on various 2D materials having insulating or semiconductor characteristics have been conducted.

A large number of semiconductor devices including 2D materials include P-N junctions formed by at least 2D material. There are several structures and/or methods for forming the P-N junction of the 2D material, and the following ways are representative thereof. The first method is a method of forming a P-N junction by partially inducing P-type region and N-type region in a 2D material layer through an electrical gating in a state in which a double gating structure is formed on a back surface of a substrate, on which the 2D material layer is formed. The second method, which is a method using chemical doping, is a method of forming a P-N junction by inducing a P-type or N-type material in a portion of a 2D material layer. In this case, an N-type or P-type material may be induced in the other portions of the 2D material layer if necessary. The third method is a method of forming a P-N junction by bonding a P-type material to an N-type material, and both sides may be 2D materials, or one side may be a bulk material and the other may be a 2D material.

However, such a P-N junction using an existing 2D material has a complex structure in which two different voltages should be applied, is difficult to ensure controllability or reproducibility thereof, or uses different types of materials as a P-type material and an N-type material, and thus an interface issue may be caused.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The exemplary embodiments disclosed herein may provide a semiconductor device including a two-dimensional (2D) material having a simple structure and not having any interface issues.

The exemplary embodiments disclosed herein may also provide a semiconductor device including a 2D material having excellent electric or physical characteristics and not having any interface issues.

The exemplary embodiments disclosed herein may further provide a semiconductor device including a 2D material having a reversible P-N diode characteristic.

According to an aspect of an exemplary embodiment, there is provided a semiconductor device including: a substrate; a two-dimensional (2D) material layer formed on the substrate and having a first region and a second region adjacent to the first region; and a source electrode and a drain electrode provided to be respectively in contact with the first region and the second region of the 2D material layer, wherein the second region of the 2D material layer includes an oxygen adsorption material layer in which oxygen is adsorbed on a surface of the second region.

A difference between a work function of the oxygen adsorption material layer and a work function of the 2D material layer in the first region may be 0.3 eV or more.

The 2D material layer may be formed of $MoS_2$.

An oxygen adsorption rate of the oxygen adsorption material layer formed on the surface of the second region of the 2D material layer may be 2% or more.

The oxygen adsorption rate of the oxygen adsorption material layer formed on the surface of the second region of the 2D material layer may be in a range of 2% to 30%.

The source electrode and the drain electrode are formed of different materials.

One electrode among the source and drain electrodes is formed of Cr or Au and the other electrode among the source and drain electrodes is formed of Pd.

The semiconductor device may further include a passivation layer formed to cover the first region of the 2D material layer.

The passivation layer may be formed of an insulating material configured to prevent oxygen from penetrating a surface of the first region.

According to an aspect of another exemplary embodiment, there is provided a semiconductor device including a multi-layered structure, the device including: a semiconductor layer formed of a 2D material and having a first region and a second region, wherein the semiconductor layer includes an oxygen adsorption material layer in which oxygen is adsorbed on a surface of the 2D material in the second region; and a non-semiconductor layer provided on a surface of the semiconductor layer.

The semiconductor device may be a tunneling device, and the semiconductor layer may be a tunneling layer.

The semiconductor device may be a binary junction transistor (BJT), and the semiconductor layer may be a tunneling layer.

The semiconductor device may be a barristor, and the semiconductor layer may be a channel layer.

The semiconductor device may be a field effect transistor (FET), and the semiconductor layer may be a channel layer.

The first region may be adjacent to the second region, and the semiconductor device may be a diode.

According to an aspect of another exemplary embodiment, there is provided a semiconductor device including: a substrate; a 2D material layer formed on the substrate and having a first region and a second region adjacent to the first region; and a source electrode and a drain electrode provided to be respectively in contact with the first region and the second region of the 2D material layer, wherein a first oxygen adsorption rate which is an amount of oxygen adsorbed on a surface of the first region of the 2D material layer is different from a second oxygen adsorption rate which is an amount of oxygen adsorbed on a surface of the second region of the 2D material layer.

The first oxygen adsorption rate may be 0% and the second oxygen adsorption rate may be 2% or more.

The second oxygen adsorption rate may be in a range of 2% to 30%.

Other features and aspects will be apparent from the following detailed description, the drawings, and the claims.

Figure 1:
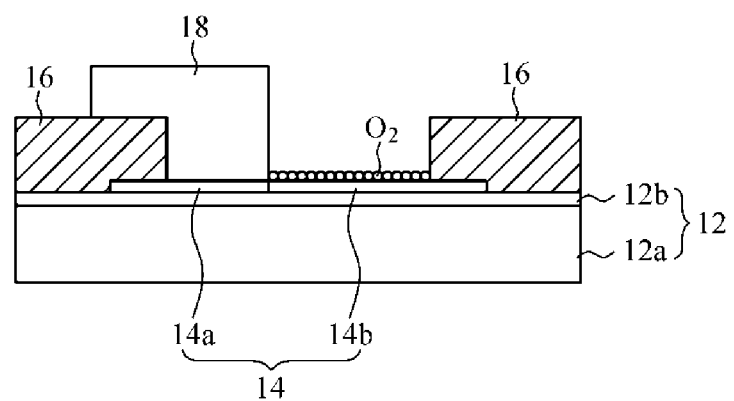
FIG. 1 is a cross-sectional view illustrating an example of a semiconductor device including a two-dimensional (2D) material according to an exemplary embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Hereinafter, exemplary embodiments will be described in detail with reference to the accompanying drawings. Terms used herein are selected by considering functions in the exemplary embodiment and meanings may vary depending on, for example, a user or operator's intentions or customs. Therefore, in the following exemplary embodiments, when terms are specifically defined, the meanings of terms should be interpreted based on those definitions, and otherwise, should be interpreted based on general meanings recognized by those skilled in the art. In this specification, a case in which a first material layer is formed on a second material layer may be interpreted to cover both a case in which the first material layer is directly formed on the second material layer and a case in which a third material layer (e.g., an upper material layer) is interposed between the first material layer and the second material layer when there is no description explicitly excluding such a feature.

FIG. 1 is a cross-sectional view illustrating an example of a semiconductor device including a two-dimensional (2D) material according to an exemplary embodiment. An example of a diode serving as a semiconductor device is illustrated in FIG. 1.

Referring to FIG. 1, the diode includes a substrate 12, a 2D material layer 14, source/drain electrodes 16, and a passivation layer 18.

The substrate 12 may include a semiconductor substrate 12a and a dielectric layer 12b. The semiconductor substrate 12a may be formed of a single-crystalline or polycrystalline semiconductor material and/or an insulating material. For example, the semiconductor substrate 12a may be a silicon (Si) substrate, but the exemplary embodiments are not limited thereto. When the semiconductor substrate 12a is formed of silicon (Si), the dielectric layer 12b may be formed of an oxide of a semiconductor material such as silicon oxide (SiO) and the like, or a nitride thereof such as silicon nitride (SiN) and the like. Components and materials (e.g., $Si/SiO_2$) of the semiconductor substrate 12a and the dielectric layer 12b described herein are exemplary, and other components or materials used in the art may also be used as components or materials of the semiconductor substrate 12a and the dielectric layer 12b. Alternatively, the substrate 12 may be entirely formed of an insulating material, and in this case, the dielectric layer 12b may not be formed.

More specifically, on the substrate 12, the 2D material layer 14 is directly formed on the dielectric layer 12b. The 2D material layer 14 may be a single layer formed of a 2D material. As described above, the 2D material is a single-layered solid of which atoms have a crystal structure, and graphene is a representative 2D material.

The 2D material layer 14 has a first region 14a and a second region 14b adjacent to the first region 14a. The 2D material layer 14 in the first region 14a (hereinafter also referred to as a 'first 2D material layer') may be a layer formed of only an intrinsic 2D material in which neither gas nor impurities are adsorbed on a surface thereof. For example, the first 2D material layer may be a portion of the 2D material layer 14, which is formed in a vacuum state at a significant level (e.g., $10^{-6}$ Torr or less) and covered with the passivation layer 18 before being exposed to air. On the other hand, the 2D material layer 14 in the second region 14b (hereinafter also referred to as a 'second 2D material layer') is a layer in a state in which oxygen ($O_2$) is adsorbed on a surface of a 2D material layer (in the exemplary embodiments, although the adsorbed oxygen ($O_2$) is illustrated slightly exaggerated in the drawing, this is only schematically illustrated for convenience of explanation and understanding). In the exemplary embodiments, a portion such as the second 2D material layer in which oxygen is adsorbed on a surface thereof is referred to as 'an oxygen adsorption material layer.' Since a diode including the above 2D material layer 14 has a simple structure and a semiconductor layer is formed of a single 2D material, there is no interface issue.

The 2D material which forms such a 2D material layer 14 may be a metal chalcogenide-based material. For example, at least one of metal chalcogenide-based materials may include one transition metal of Mo, W, Nb, V, Ta, Ti, Zr, Hf, Tc, and Re and one chalcogen element of S, Se, and Te, and may be a transition metal chalcogenide material represented by $MX_2$ (Here, M denotes a transition metal and X denotes a chalcogen element). Accordingly, the transition metal chalcogenide material may be, for example, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. Alternatively, a transition metal chalcogenide-based material may not be represented by $MX_2$, and a compound (a transition metal chalcogenide material) of a transition metal of Cu and a chalcogen element of S may be expressed as, for example, CuS. Since the CuS may also be the 2D material, the CuS may be applied as a transition metal chalcogenide-based material.

As another example, the metal chalcogenide-based material may be a non-transition metal chalcogenide material including a non-transition metal. The non-transition metal may be, for example, Ga, In, Sn, Ge, Pb, etc. That is, a compound of a non-transition metal such as Ga, In, Sn, Ge, Pb, etc. and a chalcogen element such as S, Se, and Te may be used as a non-transition metal chalcogenide-based material. Accordingly, the non-transition metal chalcogenide material may be, for example, $SnSe_2$, GaS, GaSe, GaTe, GeSe, $In_2Se_3$, $InSnS_2$, etc.

According to an exemplary embodiment, types of 2D materials which form the first 2D material layer and the second 2D material layer are the same. That is, both the first and second 2D material layers 14a and 14b are formed of the same 2D material. The 2D material layer 14 may be a material having a "semiconductor" characteristic. For example, the 2D material layer 14, more specifically, the first 2D material layer in which oxygen is not adsorbed on a surface thereof, may be a P-type semiconductor or an N-type semiconductor. The second 2D material layer which is an oxygen adsorption material layer may be an N-type semiconductor or a P-type semiconductor, the opposite of the first 2D material layer.

To this end, the 2D material layer 14 may be formed of a material having a characteristic in which a difference between a work function when oxygen is adsorbed on a surface thereof and a work function when the oxygen is not adsorbed on the surface thereof is greater than or equal to a predetermined value. That is, the 2D material layer 14 may be formed of a material having a characteristic in which a work function is changed to a predetermined value or more when oxygen is adsorbed on a surface thereof. According to an exemplary embodiment, the predetermined value may be changed according to an electrical characteristic required for a semiconductor device. For example, when the semiconductor device is a diode, the 2D material layer 14 may be formed of a 2D material having a characteristic in which a difference between a work function of the second 2D material layer and a work function of the first 2D material layer is 0.3 eV or more. For cases in which a change in the work function of the 2D material layer 14 is caused by the adsorption of oxygen, it should be apparent to those skilled in the art that the present exemplary embodiment may be applied in cases of a positive change as well as a negative change.

According to an exemplary embodiment, the 2D material layer 14 may be formed of $MoS_2$ which is one of the transition metal chalcogenide materials. According to an exemplary embodiment, $MoS_2$ is a representative example of the 2D material in which a value of a work function is changed by adsorbing oxygen on a surface thereof. As described below, the value of the work function of $MoS_2$ is restored to an original value by separating the adsorbed oxygen. That is, the work function of $MoS_2$ has a reversible characteristic according to adsorbing and separating the oxygen. Hereinafter, a detailed physical characteristic of the 2D material layer 14 formed of $MoS_2$ will be described in detail with reference to experimental results.

Figure 2A:
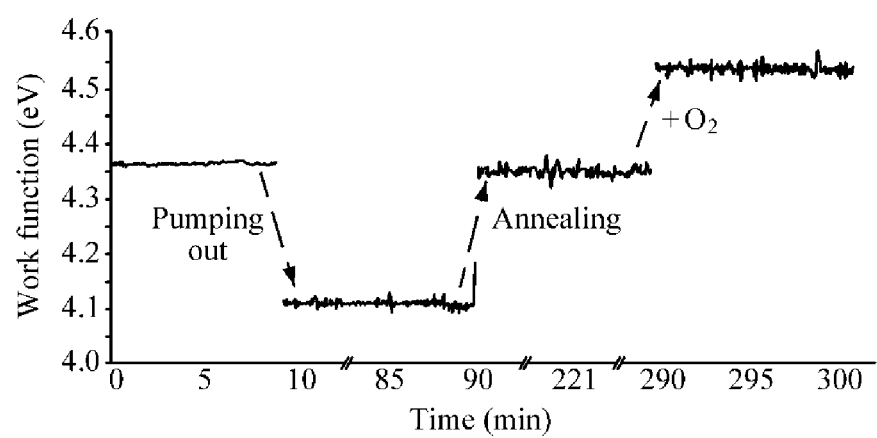
FIG. 2A is a graph illustrating a change in a work function of $MoS_2$ according to a surrounding environment.

FIG. 2A is a graph illustrating a change in a work function of $MoS_2$ according to a surrounding environment. The change in the work function illustrated in FIG. 2A is a result in which a single-layered $MoS_2$ is formed on a P-type silicon substrate and then the work function of $MoS_2$ is electrically measured using a Kelvin probe including a tip having a 3 mm diameter. The Kelvin probe may measure a work function in-situ for each pressure (in an atmospheric environment (ambient) or in a high vacuum) or for each gas atmosphere in a set-up.

Referring to FIG. 2A, the work function of $MoS_2$ was measured to be about 4.36 eV in an atmospheric environment (a time in a range of 0 to 7 minutes). When an inside of a chamber of the Kelvin probe is changed to a high vacuum state (about $10^{-9}$ Torr) by pumping out the air included in the inside of the chamber, the work function became about 4.1 eV (a time in a range of 8 to 90 minutes). When an annealing process is performed at a temperature of about 400° C. for about 2 hours, the work function becomes about 4.35 eV again and was restored to an initial state (a time in a range of 90 to 221 minutes). Subsequently, when oxygen ($O_2$) is injected into the inside of the chamber, the work function is increased to 4.53 eV (a time of 290 minutes or more).

Accordingly, it can be seen that the work function of $MoS_2$ in air becomes about 4.36 eV, and about 4.1 eV in a high vacuum state. Also, it can be seen that the value of the work function of $MoS_2$ is restored to an original value when oxygen is adsorbed again in a high vacuum state, and as an amount of the adsorbed oxygen is increased by increasing a concentration of oxygen in a surrounding environment, the work function of $MoS_2$ is increased to about 4.53 eV. Also, it can be seen that a main factor in changing the work function of $MoS_2$ is oxygen ($O_2$). It was actually confirmed, through experimental results, that the work function of $MoS_2$ is not changed at all when only nitrogen instead of oxygen is injected in the same environment and tested using the same process as the process used to obtain the graph of FIG. 2A.

Figure 2B:
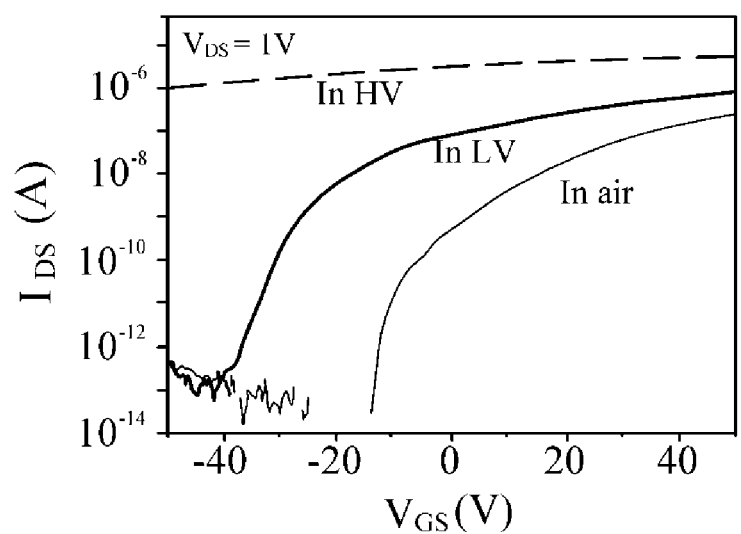
FIG. 2B is a graph illustrating a current-voltage (IV) characteristic according to a concentration change in $O_2$ in a surrounding environment.
Figure 2C:
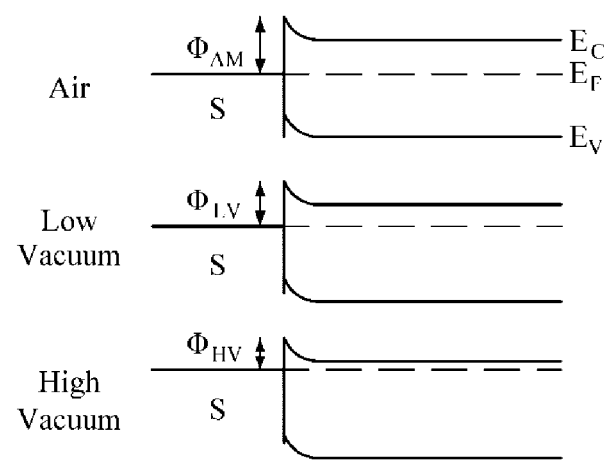
FIG. 2C is a graph illustrating an energy level of the IV characteristic graph of FIG. 2B.

FIGS. 2B and 2C are graphs respectively illustrating a current-voltage (IV) characteristic according to a concentration change in $O_2$ in a surrounding environment and an energy level thereof. Referring to FIGS. 2B and 2C, it can be seen that a threshold voltage Vth of a $MoS_2$ back gate transistor is about −15 V and shows an N-type characteristic in air, and the threshold voltage thereof is gradually increased toward negative from a low vacuum to a high vacuum. On the other hand, it can be seen that the threshold voltage thereof is moved toward positive when an oxygen gas flows into the inside of the chamber again in a high vacuum state.

Accordingly, it can be seen that a semiconductor characteristic is also changed to a negative or positive direction, respectively, when oxygen is adsorbed on or separated from the surface of $MoS_2$. More specifically, it can be seen that a doping level of the 2D material layer is changed toward a P-type semiconductor when oxygen is adsorbed on a surface thereof, and on the other hand, the doping level is changed toward an N-type semiconductor when oxygen is separated from a surface thereof. More accurately, the 2D material layer becomes an N-type semiconductor when oxygen is adsorbed on the 2D material layer formed of $MoS_2$, and the 2D material layer becomes an $N^{++}$-type semiconductor when becoming intrinsic $MoS_2$ when oxygen is separated from the 2D material layer.

Therefore, an electrical characteristic of the 2D material layer, for example, a doping level may be controlled by adjusting an amount or adsorption rate of oxygen adhered or adsorbed on the surface of the 2D material layer such as MoS. As illustrated in FIG. 1, when oxygen is not adsorbed in the first region 14a of the 2D material layer 14 and is adsorbed in the second region 14b adjacent thereto, a doping level of the first 2D material layer is different from that of the second 2D material layer, and thus the 2D material layer 14 may be used as a semiconductor device such as a P-N junction diode and the like.

Figure 3:
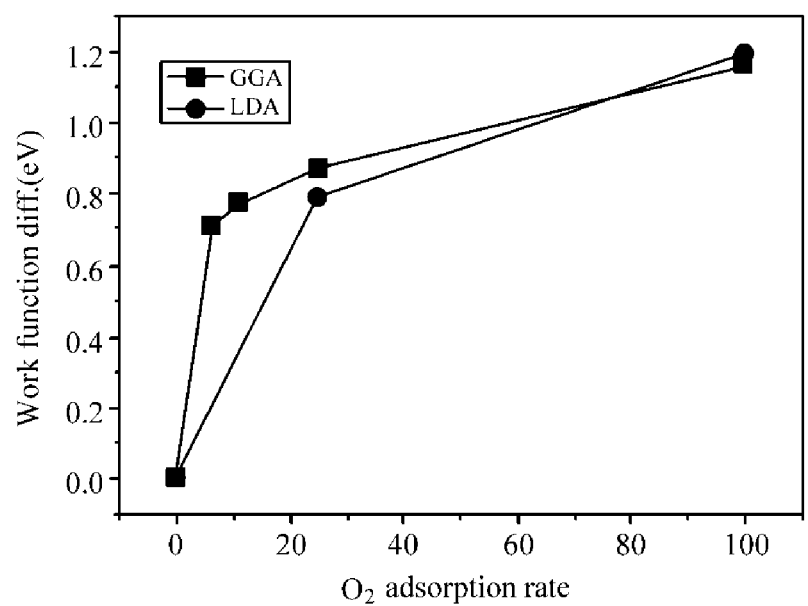
FIG. 3 is a graph illustrating a change in a work function according to a change in an adsorption rate of oxygen which is adhered to a surface of a 2D material layer formed of $MoS_2$.

FIG. 3 is a graph illustrating a change in a work function according to a change in an adsorption rate of oxygen which is adhered to a surface of a 2D material layer formed of $MoS_2$.

Referring to FIG. 3, it can be seen that a work function is changed up to 1.2 eV when an oxygen ($O_2$) adsorption rate or an $O_2$ coverage is changed from 0% to 100%. That is, a work function of $MoS_2$ having an oxygen adsorption rate of 100% is greater than a work function of intrinsic $MoS_2$ having an oxygen adsorption rate of 0% by 1.2 eV. This result indicates that, when an oxygen gas is intentionally adsorbed on a surface of the 2D material layer formed of $MoS_2$, a work function change in the 2D material layer may be caused, and as an amount of the adsorbed oxygen gas is increased, a work function change may be increased. A work function of $MoS_2$ having an oxygen adsorption rate of about 2% is greater than a work function of intrinsic $MoS_2$ having an oxygen adsorption rate of 0% by about 0.3 eV.

Subsequently, referring to FIG. 1, the diode includes the source and drain electrodes 16. In the present exemplary embodiment, there is no particular limitation on types of conductive materials used as the source and drain electrodes 16, and all types of conductive materials used in the art may be used. The source and drain electrodes 16 may be formed in a symmetrical composition in which electrodes are formed of the same material, or in an asymmetrical composition in which electrodes are formed of different materials (e.g., one electrode is formed of Cr/Au and the other electrode is formed of Pd). With the latter case, when the source and drain electrodes 16 having an asymmetrical composition are used, a rectification phenomenon when forming a P-N diode may be improved. As an experimental result, even when the source and drain electrodes 16 are formed to have an asymmetrical composition, an IV characteristic between the source and drain, which was measured in a vacuum state, was found to be a linear characteristic.

The passivation layer 18 serves to prevent oxygen from being adsorbed on the surface of the 2D material layer 14 formed in the first region 14a. Specifically, the passivation layer 18 prevents oxygen from being adsorbed on the first region 14a of the 2D material layer 14, that is, on the surface of the first 2D material layer in a process in which oxygen is adsorbed on the second region 14b of the 2D material layer 14, that is, on the surface of the second 2D material layer. Therefore, the passivation layer 18 is formed to cover at least the first region 14a of the 2D material layer 14, that is, the surface of the first 2D material layer. The passivation layer 18 is formed not to cover the surface of the second 2D material layer.

Since the passivation layer 18 serves to prevent oxygen from being adsorbed on a material layer formed thereunder in this manner, the passivation layer 18 may be formed of an insulating material having dense film quality, which may effectively prevent oxygen from penetrating thereinto. For example, the passivation layer 18 may be formed of aluminum oxide ($Al_2O_3$), but this material is only exemplary.

Figure 4A:
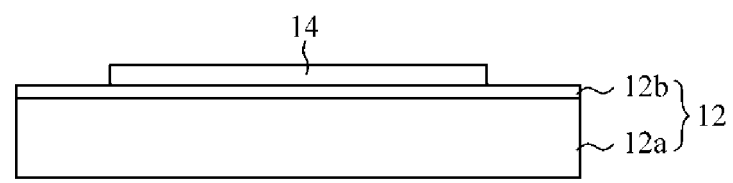
FIGS. 4A, 4B, and 4C are cross-sectional views sequentially illustrating a method of forming a diode of FIG. 1.
Figure 4B:
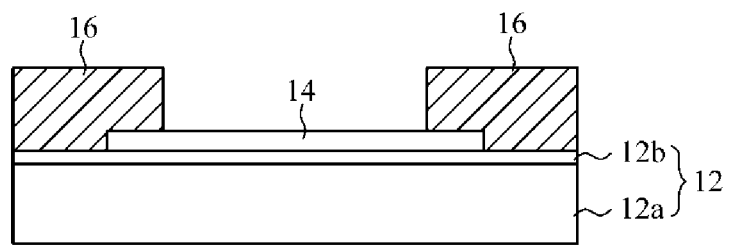
Figure 4C:
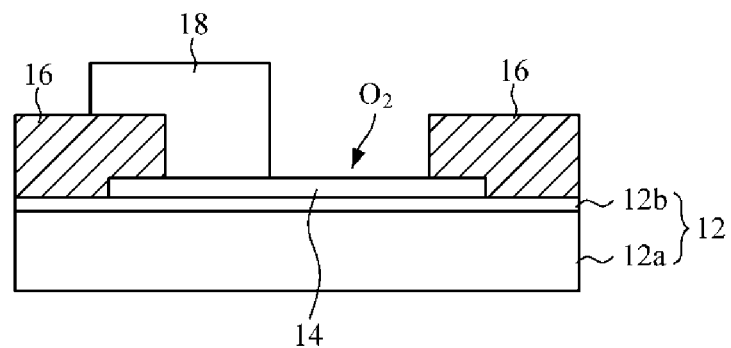

FIGS. 4A, 4B, and 4C are cross-sectional views sequentially illustrating a method of forming the diode of FIG. 1.

Referring to FIG. 4A, a substrate 12 is prepared. For example, the substrate 12 may be prepared by forming a dielectric layer 12b on an upper surface of a semiconductor substrate 12a such as silicon and the like. The dielectric layer 12b may be formed using a process known to those skilled in the art in the field of semiconductors, such as a thermal oxidation process or a chemical vapor deposition (CVD) process. Then, a 2D material layer 14 is formed on the substrate 12. In the present exemplary embodiment, there is also no particular limitation on a specific method of forming the 2D material layer 14, and a method such as a transfer method and the like may be used.

Referring to FIG. 4B, source and drain electrodes 16 are formed to be in contact with both ends of the 2D material layer 14. A process of forming the source and drain electrodes 16 is performed in a vacuum atmosphere, and a semiconductor process, such as a sputtering process and the like, which is a process of forming a conductive pattern, may be used.

Subsequently, referring to FIG. 4C, a passivation layer 18 is formed to cover a portion of the 2D material layer 14, more specifically, to cover the first region 14a (see FIG. 1) of the 2D material layer 14. As described above, the passivation layer 18 may be formed of an insulating material such as aluminum oxide and the like. Oxygen ($O_2$) is adsorbed on the second region 14b (see FIG. 1) of the 2D material layer 14. For example, oxygen may be adsorbed on the 2D material layer 14, that is, the second region 14b (see FIG. 1) of the 2D material layer 14, which is exposed through a process in which a result of FIG. 4C is exposed to an air atmosphere, a thermal oxidation process, and/or a method of additionally supplying oxygen to the inside of the chamber.

FIGS. 5A, 5B, 5C, and 5D are graphs for describing an electrical characteristic of the diode of FIG. 1.

Figure 5A:
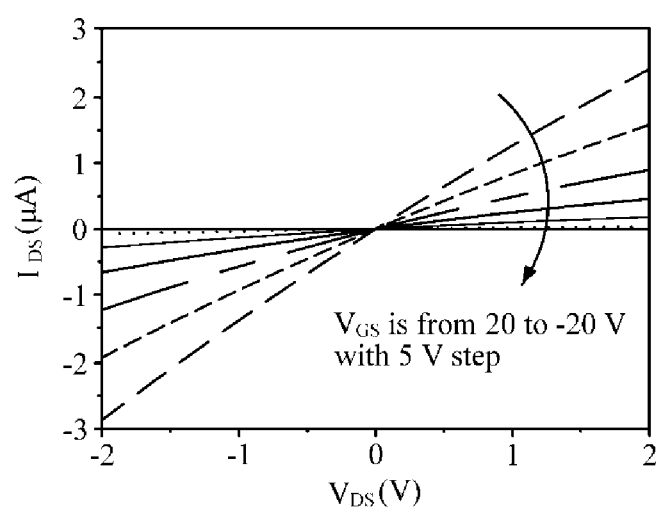
FIGS. 5A, 5B, 5C, and 5D are graphs for describing an electrical characteristic of the diode of FIG. 1.

First, FIG. 5A is a graph illustrating an IV measured for the 2D material layer 14 formed of MoS before the formation of the passivation layer 18 in the diode of FIG. 1 (see FIG. 4B). Therefore, the IV graph of FIG. 5A illustrates a state in which oxygen is not adsorbed on any portion of the 2D material layer 14. Referring to FIG. 5A, the 2D material layer 14 in which oxygen is not adsorbed on any surface thereof shows a characteristic as a simple resistance device.

Figure 5B:
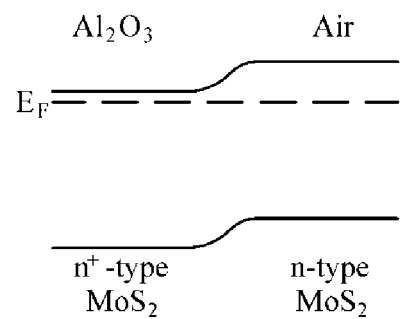
Figure 5C:
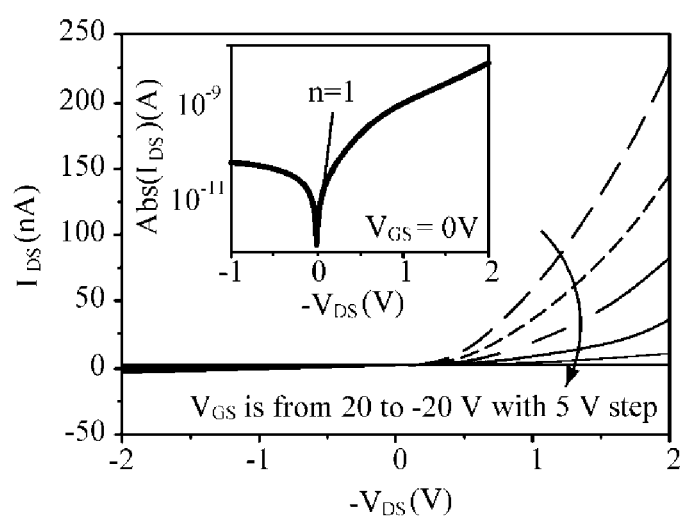

FIGS. 5B and 5C are graphs respectively illustrating an energy level and an IV measured for the 2D material layer 14 formed of MoS after the formation of the passivation layer 18 in the diode of FIG. 1 (see FIG. 4C). That is, the graphs of FIGS. 5B and 5C illustrate states in which oxygen is not adsorbed on a portion of the 2D material layer 14 and is adsorbed on the other portions thereof. For example, in a state in which passivation is performed on only a portion of the 2D material layer, oxygen may be adsorbed on the other portions of the 2D material layer by exposing a 2D material layer of a device showing the characteristic of FIG. 5A in air.

In this case, an N-type ($N^{++}$-type) region is induced in the portion of the 2D material layer in which passivation is performed and a P-type (N-type) region is induced in the exposed portion of the 2D material layer, and thus a characteristic of a general P-N junction diode through which a current flows only in one direction is shown (see FIGS. 5B and 5C). It can be seen that an ideality factor which indicates a characteristic (quality) of a diode shows 1 and a P-N junction diode having high quality is simply formed by only adsorption and separation of the oxygen.

Figure 5D:
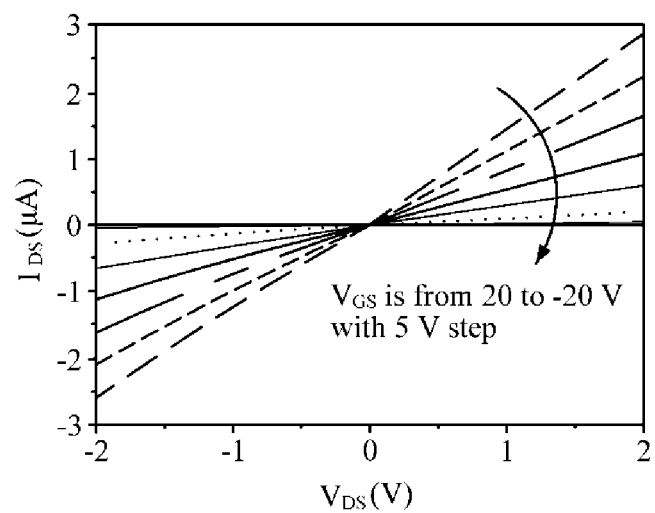

FIG. 5D is a graph illustrating an IV measured for a 2D material layer 14 formed of MoS when the diode of FIG. 1 is placed in a vacuum atmosphere. Therefore, the IV graph of FIG. 5D illustrates a device restored to a state in which oxygen is not adsorbed on any portion of the surface thereof by separating the oxygen which has been adsorbed on the surface of the 2D material layer 14. Referring to FIG. 5D, it can be seen that the 2D material layer 14, which is restored to the state in which the oxygen is not adsorbed on any portion of the surface thereof by separating the adsorbed oxygen, is restored to a simple resistance device. When the reversible characteristic of the diode of FIG. 1 is used, a single device (e.g., the semiconductor device of FIG. 1) may be used as a resistance device transistor (in vacuum), or may be selectively used as the diode according to the user's purpose. Further, since an electrical characteristic of the diode is reversibly changed according to the adsorption of the oxygen, the diode is likely to be utilized also as an oxygen sensor.

Figure 6:
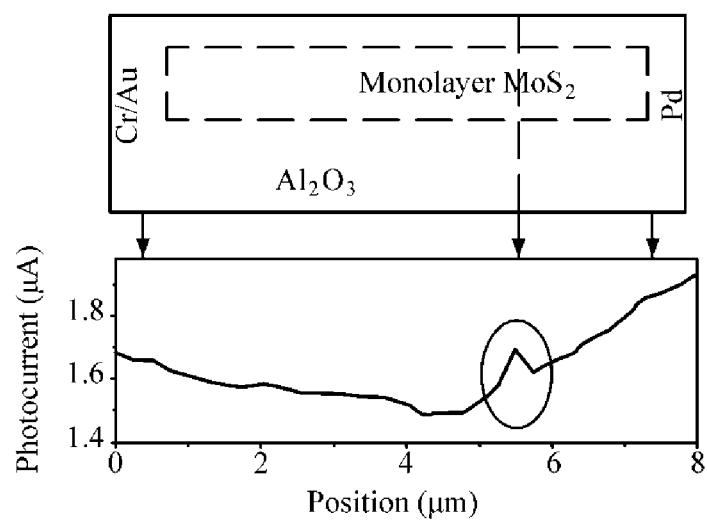
FIG. 6 is a diagram illustrating a mapping of a 2D material layer 14 constituting the diode of FIG. 1 to a photocurrent.

FIG. 6 is a diagram illustrating a mapping of the 2D material layer 14 constituting the diode of FIG. 1 to a photocurrent. In FIG. 6, Cr/Au and Pd denote source and drain electrodes, and $Al_2O_3$ denotes a passivation layer. The diagram of FIG. 6 illustrates a mapping of the 2D material layer 14 to a photocurrent generated when a laser of 487 nm focused to 1 μm is irradiated to each position of the 2D material layer 14. Referring to FIG. 6, it can be seen that a peak of a photocurrent is formed at an edge of the passivation layer formed of $Al_2O_3$ as a point at which a P-N junction is formed, that is, a position indicated by a dashed arrow. This illustration is another example illustrating a state in which a work function modulation of the 2D material layer is possible using the oxygen adsorption and separation on and from the surface of the 2D material layer formed of $MoS_2$. Furthermore, when the characteristic of FIG. 6 is used, a P-N junction diode having components of FIG. 1 may be used as a photodetector or a light-emitting diode (LED).

In this manner, a configuration of the P-N junction of the 2D material layer included in the diode according to the above-described exemplary embodiment, that is, a configuration of the P-N junction obtained by varying the concentration of the oxygen adsorbed on the 2D material layer, and/or a technical configuration in which a doping level may be adjusted by adjusting a concentration of the oxygen adsorbed on the surface thereof may be applied to various semiconductor devices (electronic devices) for a number of purposes. For example, the P-N junction may be applied to a diode, and also to various devices such as a solar cell, a photodetector, a transistor, a tunneling device, a memory device, a logic device, a light emitting device, an energy storage device, a display device, and the like. According to an exemplary embodiment, the transistor may have various configurations such as a field effect transistor (FET), a thin film transistor (TFT), a binary junction transistor (BJT), a barrier transistor (e.g., barristor), and the like.

In this manner, any device using a P-N junction may be applied to the 2D material layer including at least two regions having different adsorption rates of oxygen, may be applied instead of Si of an existing Si device, and may be applied to a stackable device, a flexible device, a transparent device, and the like. Since the 2D material layer is formed of a 2D material, the 2D material layer may be flexible, and since the 2D material layer has a very small thickness, the 2D material layer may have a transparent characteristic. Therefore, such a material may be usefully and advantageously applied to a stackable device, a flexible device, a transparent device, and the like.

A semiconductor device including such a 2D material layer may be a multi-layered structure. More specifically, the semiconductor device may include a semiconductor layer including a 2D material layer having two regions having different oxygen adsorption rates (in a range of 0% to 100%) on a surface thereof and at least one non-semiconductor layer provided on at least one surface of the semiconductor layer. According to an exemplary embodiment, the semiconductor layer may be formed with only the 2D material layer or another semiconductor layer may be additionally provided.

The at least one non-semiconductor layer may include at least one conductive layer and/or at least one insulating layer. The conductive layer may include a conductive 2D material layer, and the insulating layer may include an insulating 2D material layer. For example, the conductive 2D material layer may include graphene and the like, and the insulating 2D material layer may include hexagonal boron nitride (h-BN) and the like. According to an exemplary embodiment, the non-semiconductor layer may not be a 2D material. Various insulating materials and conductive materials used in a general semiconductor process may be applied to the non-semiconductor layer. The insulating material may include silicon oxide, silicon oxynitride, silicon nitride, a high-k dielectric material (aluminum oxide, hafnium oxide, and the like) having a greater dielectric constant than silicon nitride, an insulating organic material (polymer), and the like. The conductive material may include a metal such as Ti, Al, Cr, Au, Ni, Pt, and the like, a metal compound, a conductive organic material (polymer), or the like. Since all main components of the semiconductor device are formed of a 2D material when the non-semiconductor layer is formed of the 2D material, it may be advantageous to miniaturize and highly integrate the device. Further, it may be possible to implement a flexible device, a transparent device, and the like.

Hereinafter, various semiconductor devices including a 2D material layer having at least two regions having different oxygen adsorption rates (in a range of 0% to 100%) on a surface thereof will be schematically described with reference to FIGS. 7 to 10.

Figure 7:
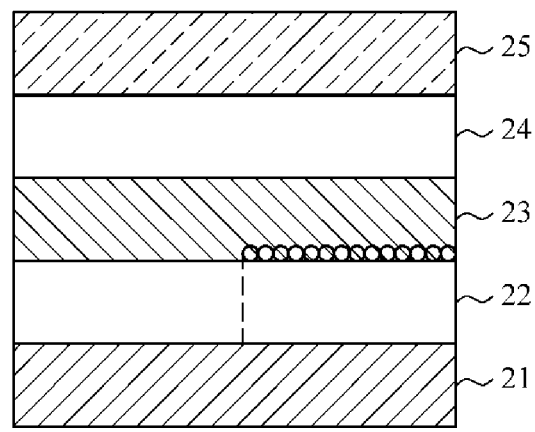
FIG. 7 is a configuration diagram schematically illustrating an example of a tunneling device.

FIG. 7 is a configuration diagram illustrating an example of a tunneling device as an example of a semiconductor device. Referring to FIG. 7, the tunneling device includes a 2D material layer 22 including two regions having different oxygen adsorption rates (in a range of 0% to 100%) on a surface thereof, a first conductive layer 21 formed on a first surface (e.g., a lower surface) of the 2D material layer 22, a second conductive layer 23 formed on a second surface (e.g., an upper surface) of the 2D material layer 22, an insulating layer 24 formed on the second conductive layer 23, and a third conductive layer 25 formed on the insulating layer 24. In FIG. 7, the 2D material layer 22 is illustrated to have an NP structure (e.g., an oxygen adsorption rate in a left region is 0% and oxygen having a predetermined adsorption rate is adsorbed in only a right region), but this is exemplary only, and the 2D material layer 22 may have a structure of PN, PNP, NPN, and the like or a plurality of regions having different bandgaps. In the semiconductor device serving as a tunneling device, the 2D material layer 22 may be a tunneling layer, the first conductive layer 21 may be a drain electrode, the second conductive layer 23 may be a source electrode, the third conductive layer 25 may be a gate electrode, and the insulating layer 24 may be a gate insulating layer. An electrical characteristic of the 2D material layer 22 or an electrical characteristic of an interface between the second conductive layer 23 and the 2D material layer 22 may be controlled by the third conductive layer 25. A current may flow between the first and second conductive layers 21 and 23 by the tunneling of electric charges through the 2D material layer 22.

In FIG. 7, the first to third conductive layers 21, 23, and 25 may be formed of a conductive 2D material, or a general conductive material other than a 2D material. Specifically, the second conductive layer 23 may be formed of a conductive 2D material such as graphene. Further, the insulating layer 24 may be formed of an insulating 2D material such as h-BN, or a general insulating material other than a 2D material.

Figure 8:
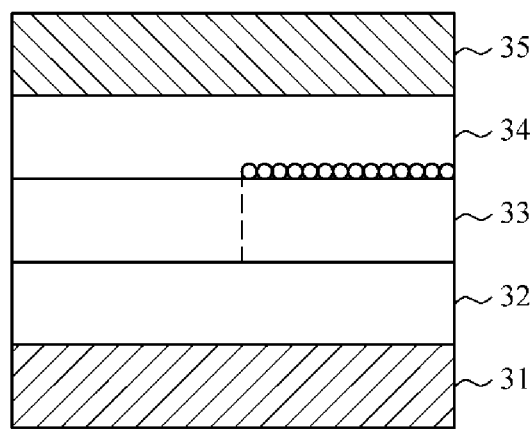
FIG. 8 is a configuration diagram schematically illustrating an example of a binary junction transistor (BJT)

FIG. 8 is a configuration diagram illustrating an example of a BJT as another example of the semiconductor device. Referring to FIG. 8, the BJT includes a 2D material layer 33 including two regions having different oxygen adsorption rates (in a range of 0% to 100%) on a surface thereof, first and second insulating layers 32 and 34 formed on upper and lower surfaces of the 2D material layer 33, a first conductive layer 31 formed to face the 2D material layer 33 with the first insulating layer 32 interposed therebetween, and a second conductive layer 35 formed to face the 2D material layer 33 with the second insulating layer 34 interposed therebetween. In FIG. 8, the 2D material layer 33 is illustrated to have an NP structure, but this configuration is exemplary only, and the 2D material layer 33 may have a structure of PN, PNP, NPN, and the like or a plurality of regions having different bandgaps. In the semiconductor device serving as the BJT, the 2D material layer 33 may be a tunneling layer or a base. The first conductive layer 31 may be an emitter, the second conductive layer 35 may be a collector, and the emitter and the collector may be electrode elements. The first insulating layer 32 may be a first barrier layer, and the second insulating layer 34 may be a second barrier layer. The first insulating layer 32 may be a tunneling barrier layer, and the second insulating layer 34 may be a filtering barrier layer.

Figure 9:
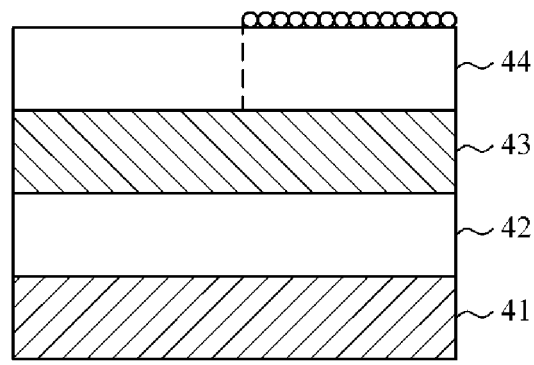
FIG. 9 is a configuration diagram schematically illustrating a portion of a barrier transistor.

FIG. 9 is a configuration diagram schematically illustrating a portion of a barrier transistor (e.g., barristor) as still another example of the semiconductor device. Referring to FIG. 9, the barrier transistor includes a 2D material layer 44 including two regions having different oxygen adsorption rates (in a range of 0% to 100%) on a surface thereof, a first conductive layer 43 formed to be in contact with the 2D material layer 44, a second conductive layer 41 formed to be spaced apart from the first conductive layer 43, and an insulating layer 42 formed between the first conductive layer 43 and the second conductive layer 41. A source electrode and a drain electrode which are in contact with the semiconductor layer 44 may be further provided. Here, when the first conductive layer 43 is formed of graphene, the semiconductor device in the present exemplary embodiment may be referred to as graphene barristor.

In the present exemplary embodiment, the 2D material layer 44 may serve as a channel layer, and the first conductive layer 43 may serve to form a Schottky barrier in an interface with the 2D material layer 44. The insulating layer 42 may be a gate insulating layer, and the second conductive layer 41 may be a gate electrode. A height of the Schottky barrier may be adjusted by a voltage applied to the second conductive layer 41, and thus, ON/OFF of the barrier transistor may be controlled. More specifically, a current may flow through the source electrode and the drain electrode when the height of the Schottky barrier is low, and the flow of the current may be blocked when the height of the Schottky barrier is high.

Figure 10:
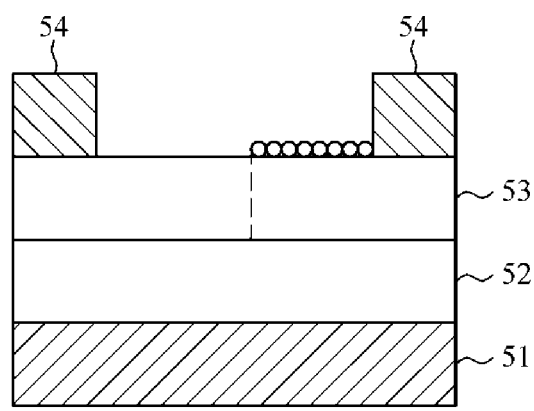
FIG. 10 is a configuration diagram schematically illustrating a portion of a field effect transistor (FET).

FIG. 10 is a configuration diagram schematically illustrating a portion of a FET as yet another example of the semiconductor device. A photodetector may also have a structure similar to the semiconductor device of FIG. 10. Referring to FIG. 10, the FET includes a 2D material layer 53 including two regions having different oxygen adsorption rates (in a range of 0% to 100%) on a surface thereof, an insulating layer 52 formed on an surface of the 2D material layer 53, for example, on a lower surface thereof, a first conductive layer 51 formed to face the 2D material layer 53 with the insulating layer 52 interposed therebetween, and second and third conductive layers 54 formed to be spaced apart from each other on the other surface of the 2D material layer 53, for example, on an upper surface thereof.

In the present exemplary embodiment, the 2D material layer 53 may serve as a channel layer, and may have, for example, a PNP structure or an NPN structure. The insulating layer 52 may be a gate insulating layer, and the first conductive layer 51 may be a gate electrode. The second and third conductive layers 54 may be a source electrode and a drain electrode, respectively. The second and third conductive layers 54 may be in contact with a P-region of the 2D material layer 53 when the 2D material layer 53 has a PNP structure, and on the other hand, the second and third conductive layers 54 may be in contact with an N-region of the 2D material layer 53 when the 2D material layer 53 has an NPN structure. Meanwhile, when the semiconductor device of FIG. 10 is used as a photodetector, the 2D material layer 53 may be a photoactive layer.

The above descriptions are only descriptions of certain exemplary embodiments, and should not be construed as limiting the scope of the exemplary embodiments. The scope of the exemplary embodiments should be defined by the claims, and all technical modifications and variations falling within the spirit and scope of the exemplary embodiments should be construed as being included in the scope of the claims. Therefore, it should be clear to those skilled in the art that the above-described descriptions may be implemented with modifications which modify the exemplary embodiments into various forms.

The current exemplary embodiments can be implemented as computer readable codes in a computer readable record medium. Codes and code segments constituting the computer program can be easily inferred by a skilled computer programmer in the art. The computer readable recording medium includes all types of recordable media in which computer readable data are stored. Examples of the computer readable recording medium include a ROM, a RAM, a CD-ROM, a magnetic tape, a floppy disk, and an optical data storage. Further, the recording medium may be implemented in the form of a carrier wave such as an Internet transmission. In addition, the computer readable recording medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device comprising:
    a substrate;
    a two-dimensional (2D) material layer formed on the substrate and having a first region and a second region adjacent to the first region;
    a source electrode and a drain electrode provided to be respectively in contact with the first region and the second region of the 2D material layer; and
    a passivation layer formed to cover the first region of the 2D material layer,
    wherein the second region of the 2D material layer includes an oxygen adsorption material layer in which oxygen is adsorbed on a surface of the second region.

2. The semiconductor device of claim 1, wherein a difference between a first work function of the oxygen adsorption material layer and a second work function of the 2D material layer in the first region is 0.3 eV or more.

3. The semiconductor device of claim 2, wherein the 2D material layer is formed of $MoS_2$.

4. A semiconductor device comprising:
    a substrate;
    a two-dimensional (2D) material layer formed on the substrate and having a first region and a second region adjacent to the first region; and
    a source electrode and a drain electrode provided to be respectively in contact with the first region and the second region of the 2D material layer,
    wherein the second region of the 2D material layer includes an oxygen adsorption material layer in which oxygen is adsorbed on a surface of the second region, and
    wherein an oxygen adsorption rate of the oxygen adsorption material layer formed on the surface of the second region of the 2D material layer is 2% or more.

5. The semiconductor device of claim 4, wherein the oxygen adsorption rate of the oxygen adsorption material layer formed on the surface of the second region of the 2D material layer is in a range of 2% to 30%.

6. The semiconductor device of claim 1, wherein the source electrode and the drain electrode are formed of different materials.

7. The semiconductor device of claim 1, wherein one electrode among the source and drain electrodes is formed of Cr or Au and another electrode among the source and drain electrodes is formed of Pd.

8. The semiconductor device of claim 1, wherein the passivation layer is formed of an insulating material configured to prevent oxygen from penetrating a surface of the first region.

9. A semiconductor device including a multi-layered structure, the semiconductor device comprising:
    a semiconductor layer formed of a 2D material and having a first region and a second region, wherein the semiconductor layer includes an oxygen adsorption material layer in which oxygen is adsorbed on a first surface of the 2D material in the second region; and
    a non-semiconductor layer provided on a second surface of the semiconductor layer.

10. The semiconductor device of claim 9, wherein:
    the semiconductor device is a tunneling device; and
    the semiconductor layer is a tunneling layer.

11. The semiconductor device of claim 9, wherein:
    the semiconductor device is a binary junction transistor (BJT); and
    the semiconductor layer is a tunneling layer.

12. The semiconductor device of claim 9, wherein:
    the semiconductor device is a barristor; and
    the semiconductor layer is a channel layer.

13. The semiconductor device of claim 9, wherein:
    the semiconductor device is a field effect transistor (FET); and
    the semiconductor layer is a channel layer.

14. The semiconductor device of claim 9, wherein:
    the first region is adjacent to the second region; and
    the semiconductor device is a diode.

15. A semiconductor device comprising:
    a substrate;
    a 2D material layer formed on the substrate and having a first region and a second region adjacent to the first region; and
    a source electrode and a drain electrode provided to be respectively in contact with the first region and the second region of the 2D material layer,
    wherein a first oxygen adsorption rate which is a first amount of oxygen adsorbed on a first surface of the first region of the 2D material layer is different from a second oxygen adsorption rate which is a second amount of oxygen adsorbed on a second surface of the second region of the 2D material layer.

16. The semiconductor device of claim 15, wherein the first oxygen adsorption rate is 0% and the second oxygen adsorption rate is 2% or more.

17. The semiconductor device of claim 16, wherein the second oxygen adsorption rate is in a range of 2% to 30%.

* * * * *